US009607835B2

(12) United States Patent
Liu et al.

(10) Patent No.: US 9,607,835 B2
(45) Date of Patent: Mar. 28, 2017

(54) SEMICONDUCTOR DEVICE WITH BIASED FEATURE

(71) Applicant: Taiwan Semiconductor Manufacturing Company, Ltd., Hsin-Chu (TW)

(72) Inventors: Chia-Chu Liu, Shin-Chu (TW); Min-Chang Liang, Zhu-Dhong Town (TW); Mu-Chi Chiang, Hsinchu (TW); Kuei-Shun Chen, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/738,407

(22) Filed: Jun. 12, 2015

(65) Prior Publication Data

US 2015/0357460 A1    Dec. 10, 2015

Related U.S. Application Data

(62) Division of application No. 13/399,502, filed on Feb. 17, 2012, now Pat. No. 9,059,001.

(Continued)

(51) Int. Cl.
| | |
|---|---|
| *H01L 21/02* | (2006.01) |
| *H01L 21/033* | (2006.01) |
| *H01L 29/423* | (2006.01) |
| *H01L 29/51* | (2006.01) |
| *H01L 21/28* | (2006.01) |
| *H01L 21/308* | (2006.01) |
| *H01L 21/3213* | (2006.01) |
| *H01L 29/66* | (2006.01) |

(Continued)

(52) U.S. Cl.
CPC .... *H01L 21/0337* (2013.01); *H01L 21/28132* (2013.01); *H01L 21/3086* (2013.01); *H01L 21/32139* (2013.01); *H01L 29/42376* (2013.01); *H01L 29/517* (2013.01); *H01L 29/66795* (2013.01); *H01L 29/785* (2013.01); *H01L 27/10826* (2013.01); *H01L 29/78* (2013.01)

(58) Field of Classification Search
CPC ............... H01L 29/78; H01L 29/66795; H01L 27/10826
See application file for complete search history.

(56) References Cited

U.S. PATENT DOCUMENTS

| | | | |
|---|---|---|---|
| 6,585,037 | B2 | 7/2003 | Jin et al. |
| 6,800,905 | B2 | 10/2004 | Fried et al. |

(Continued)

FOREIGN PATENT DOCUMENTS

WO    WO2009144874    12/2009

*Primary Examiner* — Zandra Smith
*Assistant Examiner* — John M Parker
(74) *Attorney, Agent, or Firm* — Haynes and Boone, LLP

(57) ABSTRACT

A transistor including a gate structure with a first portion and a second portion; the first and second portions each have a first edge and an opposing second edge that are substantially collinear. The gate structure also includes an offset portion interposing the first portion and the second portion. The offset portion has a third edge and an opposing fourth edge. The third edge and the fourth edge are non-collinear with the first and second edges of the first and second portions of the gate structure. For example, the offset portion is offset or shifted from the first and second portions.

20 Claims, 21 Drawing Sheets

Related U.S. Application Data

(60) Provisional application No. 61/576,663, filed on Dec. 16, 2011.

(51) Int. Cl.
  *H01L 29/78* (2006.01)
  *H01L 27/108* (2006.01)

(56) References Cited

U.S. PATENT DOCUMENTS

| | | |
|---|---|---|
| 7,651,951 B2 | 1/2010 | Tran et al. |
| 7,862,962 B2 | 1/2011 | Xu et al. |
| 7,960,287 B2 | 6/2011 | Johnson et al. |
| 7,989,355 B2 | 8/2011 | Shieh et al. |
| 8,105,901 B2 | 1/2012 | Cheng et al. |
| 8,557,675 B2 | 10/2013 | LiCausi |
| 8,962,484 B2 | 2/2015 | Lee et al. |
| 2004/0266115 A1 | 12/2004 | Chan et al. |
| 2009/0035902 A1 | 2/2009 | Xu et al. |
| 2010/0044794 A1* | 2/2010 | Cheng .................. H01L 29/785 257/347 |

* cited by examiner

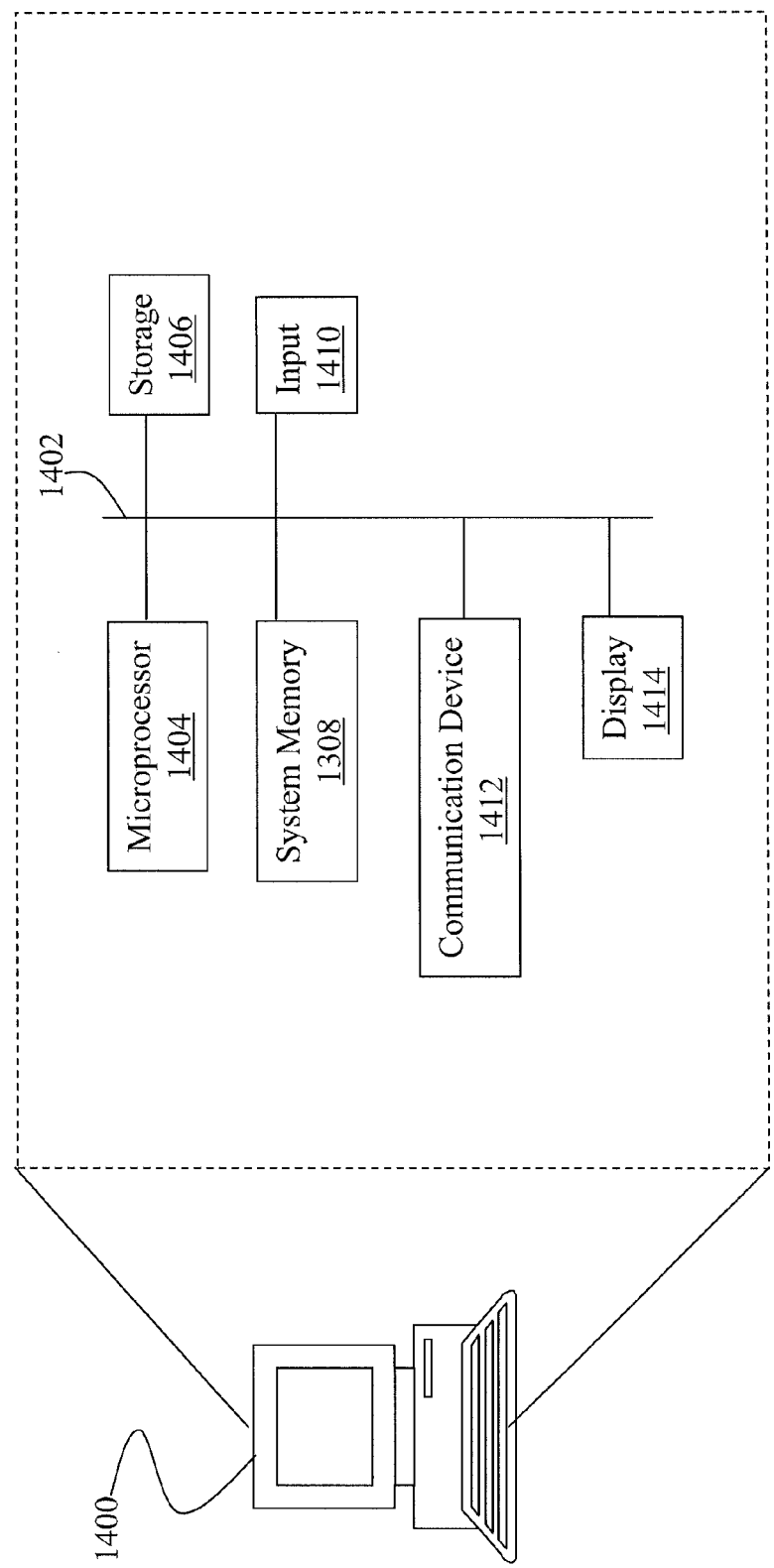

SEMICONDUCTOR DEVICE WITH BIASED FEATURE

PRIORITY DATA

The present application is a divisional application of U.S. patent application Ser. No. 13/399,502, filed Feb. 17, 2012, entitled "SEMICONDUCTOR DEVICE WITH BIASED FEATURE", which claims priority to Provisional Application Ser. No. 61/576,663, filed on Dec. 16, 2011, entitled "SEMICONDUCTOR DEVICE WITH BIASED FEATURE," the entire disclosure of which is incorporated herein by reference.

BACKGROUND

The semiconductor integrated circuit (IC) industry has experienced rapid growth. Technological advances in IC materials, design, and fabrication tools have produced generations of ICs where each generation has smaller and more complex circuits than the previous generation. In the course of these advances, fabrication methods have been developed to realize the desire for smaller feature sizes. For example, methods have been developed that reduce the pitch of features on a substrate without changing the photolithography technology used.

These methods and technological advances give rise to challenges however. For example, alignment between layers of an IC becomes both more critical, and more difficult, as the technology node decreases. Thus, what is desired is a device and method to allow for reduced pitch of features, while maintaining an alignment with an overlying feature.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 14 illustrates an embodiment of an information handling system (e.g., computer) operable to implement one or more aspects of FIGS. 1, 2, 3, 4, and/or 5.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for simplicity and clarity.

Figure 1:
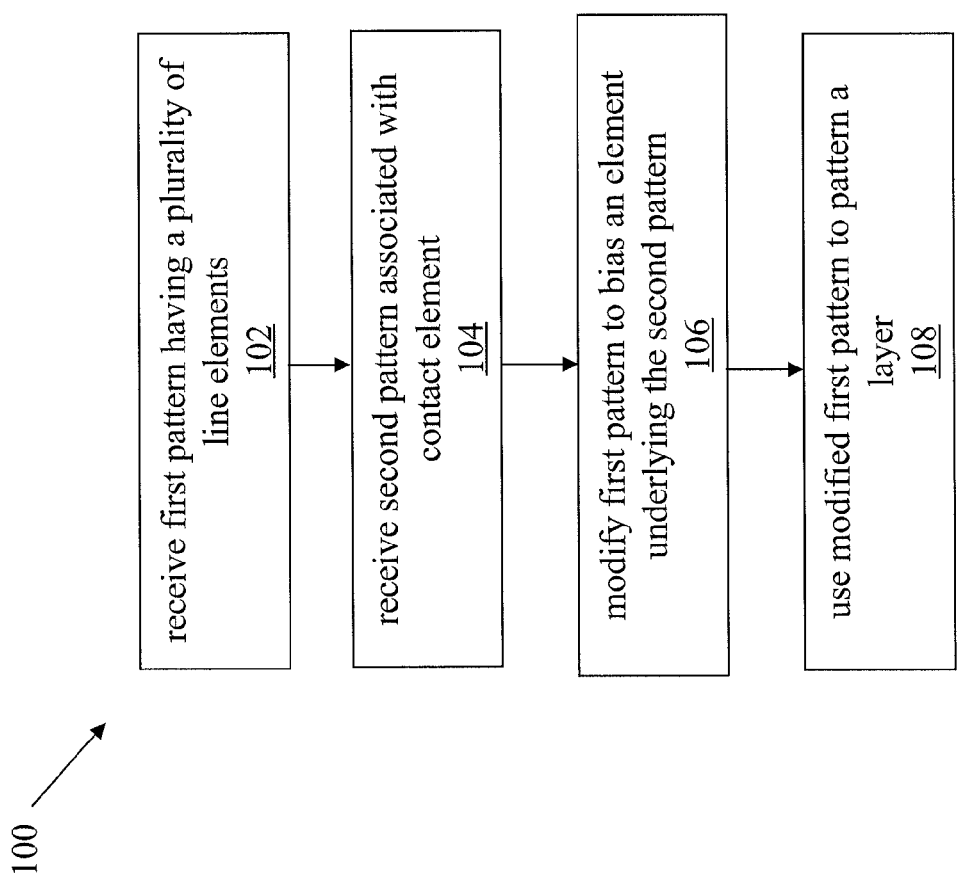
FIG. 1 is a flow chart illustrating an embodiment of designing a semiconductor device such as an IC.
Figure 2:
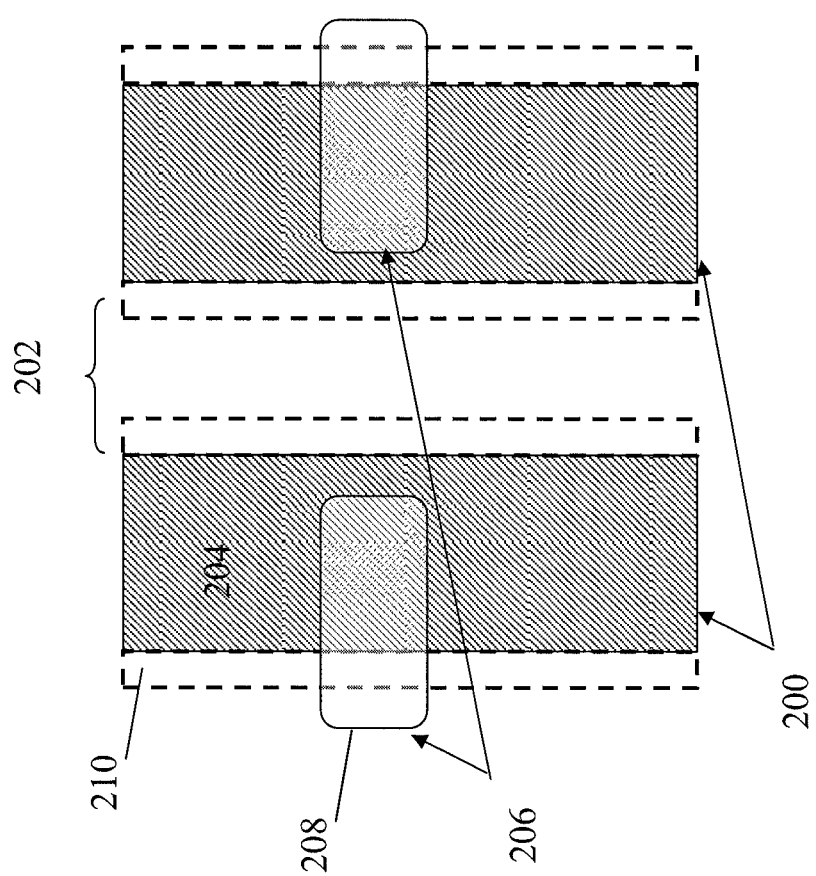
FIGS. 2, 3, and 4 illustrate top views of embodiments of patterns associated with a semiconductor device design, according to one or more aspects of the present disclosure.
Figure 3:
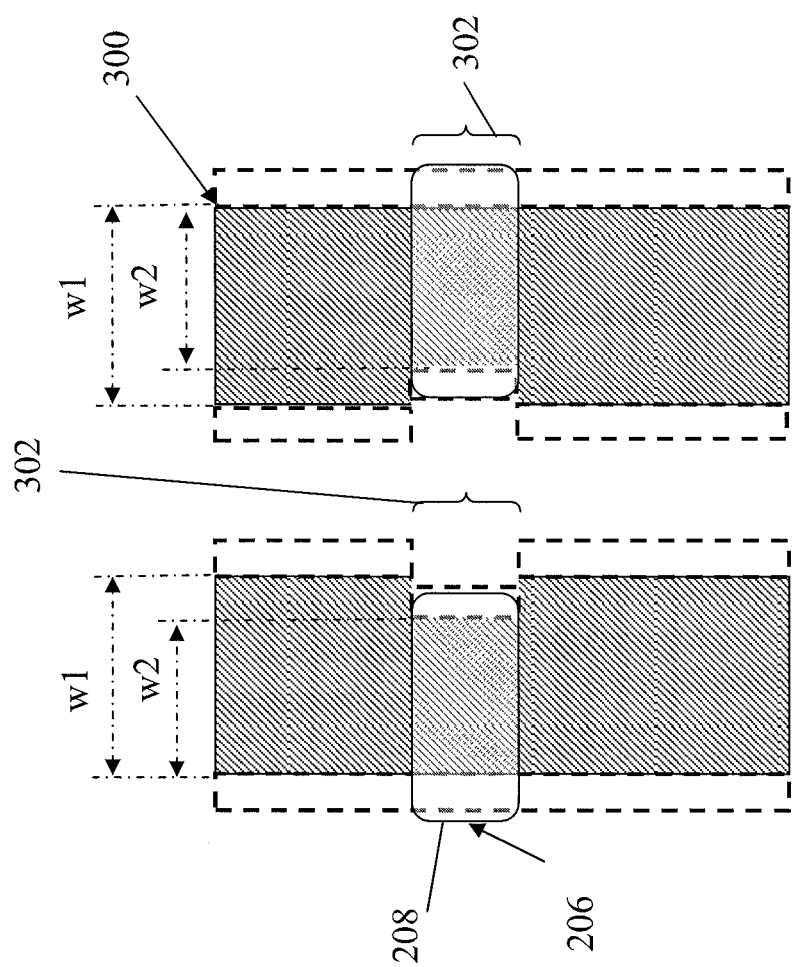
Figure 4:
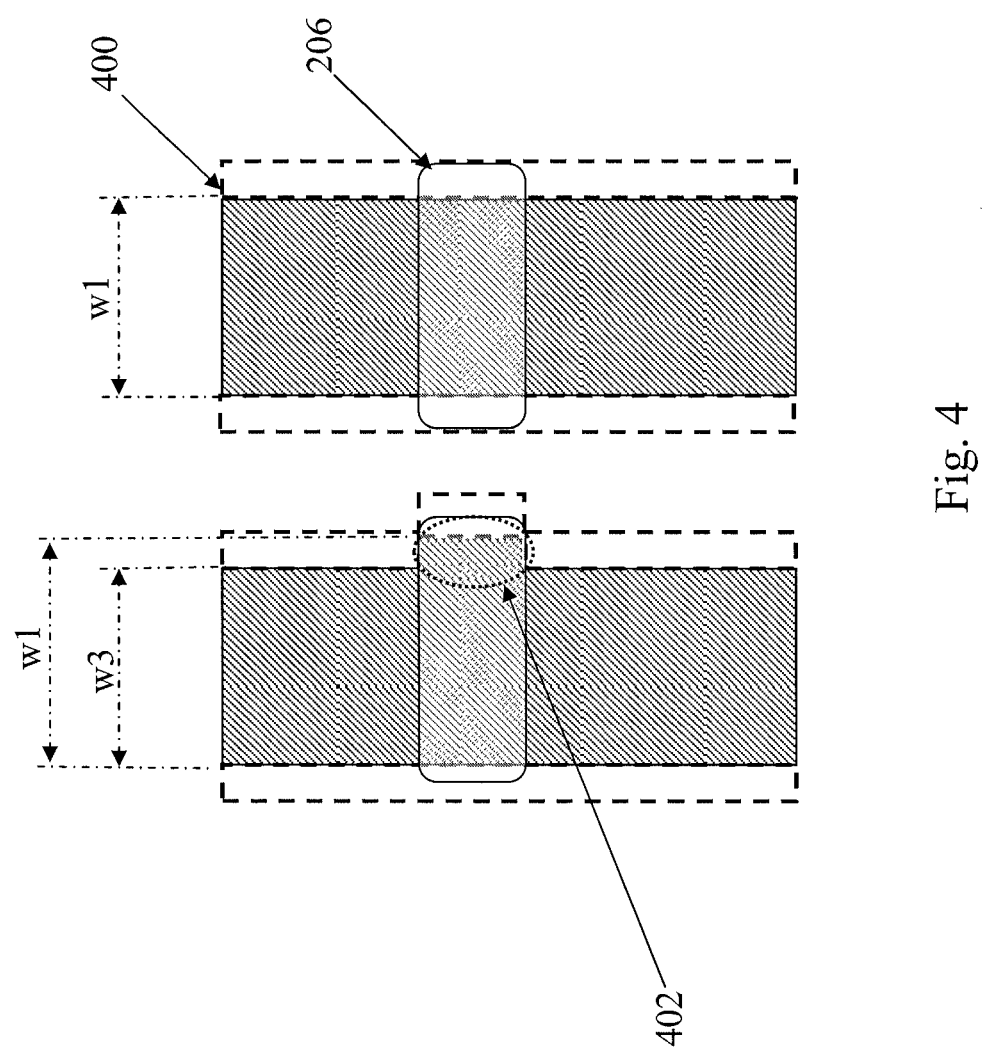

Illustrated in FIG. 1 is a method 100 of designing and providing a semiconductor device. FIGS. 2-4 are top views of patterns provided according to the method 100 of FIG. 1. A "pattern", as described throughout the disclosure, may be provided in a layout design file (e.g., GDSII file), a photomask, formed on a substrate, and/or in other suitable forms.

In an embodiment, the semiconductor device described in FIGS. 1, 2, 3, and/or 4 includes a transistor. In an embodiment, the transistor is a field effect transistor (FET) such as a FinFET (multi-gate transistor) device, or portion thereof. In other embodiments, the transistor may include a planar-type transistor having a metal or polysilicon gate structure. The method begins at block 102 where a first pattern is provided. The first pattern defines a configuration of elements providing sacrificial line structures (or features), also referred to as mandrels. For example, in an embodiment, the first pattern may define a sacrificial (dummy) line structure that is used to form spacer elements (e.g., abutting the sacrificial line structure). The width and pitch of the spacer elements may define the width and the pitch of features (e.g., gate structures) of semiconductor devices such as finFET devices. The width and pitch of the spacer element features may be provided at less than the minimum critical dimension of the photolithography process utilized (e.g., a half critical dimension process).

Referring to the example of FIG. 2, a first pattern 200 is illustrated. The first pattern 200 includes a plurality of line elements 204 interposed by a space 202. The first pattern 200 may include any number of line elements 204. The first pattern 200 may be provided in a layout design file. In an embodiment, the first pattern 200 defines a configuration of elements defining sacrificial line structures or mandrels. These sacrificial line structure may be used to form spacer elements 210 (e.g., abutting the line structure), and subsequently removed during fabrication of the semiconductor device. The width and pitch of the spacer elements 210 may define the width and the pitch of features (e.g., gate structures) of semiconductor devices. In an embodiment, the spacer elements define a portion of a feature of a transistor such as finFET element. (It is noted that the spacer elements 210 are illustrated in FIG. 2 for reference only and the patterns may not include features which define these elements. Rather the spacer elements 210 may be formed using fabrication processes after the formation of the line elements 204 on a substrate, such as described in further detail below.)

The method 100 then proceeds to block 104 where a second pattern defining a second layer of the semiconductor device is received. The second pattern may overly the first pattern (e.g., be provided on a subsequent mask of a mask set used to fabricate the semiconductor device). In an embodiment, the second pattern defines a plurality of features providing a connection to an underlying layer or feature. In an embodiment, the second pattern defines a contact element(s).

Referring again to the example of FIG. 2, a second pattern 206 is illustrated overlying the first pattern 200. The second pattern 206 includes a plurality of features 208 defining contact elements. In an embodiment, the contact elements 208 define contacts that will connect to the features (e.g., gate structures) defined by the sacrificial line structures (and adjacent spacer elements), described above with reference to block 102.

One challenge to the design provided in block 102 and 104 is the alignment of the second pattern with the first pattern. In other words, it is important that the second pattern (e.g., contact) be aligned with the appropriate portion of the first pattern (e.g., gate structure defined by spacer elements adjacent the sacrificial line features). In typical fabrication processes there may be an offset in the desire alignment due to processing and/or tool variations.

The method 100 then proceeds to block 106 where the first pattern is modified (e.g., biased) at a region underlying the second pattern. In an embodiment, the first pattern is modified to account for a misalignment or potential misalignment between the first and second patterns in fabrication processes. The modification or biasing amount or direction may be determined by model and/or experimental data indicating the alignment tolerances. In an embodiment, an offset value may indicate an amount of modification or shift of the first pattern. The offset value may be determined from the model and/or experimental data.

The modification or biasing of the first pattern may include increasing and/or decreasing the width of a line element of the first pattern. The bias may be performed at a region underlying the second pattern. The modification may include moving one or more of the edges of a line element of the first pattern such that it is non-collinear with (or no longer collinear (e.g., in line with)) the remainder of the edge of the line element. Any number of line elements may be biased.

Referring to the example of FIG. 3, the first pattern 200 (described above with reference to FIG. 2) has been modified to provide a modified pattern 300. The modified pattern 300 includes the sacrificial line elements 204 having a biased region 302. The sacrificial line elements 204 have a width w1. The sacrificial line elements 204 at the biased region 302 have a width w2. The width w2 is different than the width w1. In an embodiment, the width w2 is between approximately 0 nanometers (nm) and approximately 10 nm less than width w1. In an embodiment, the width w2 is approximately 5 nm less than w1. As illustrated, the width w2 is less than the width w1, however other embodiments are possible. In one or more such embodiments, w2 may differ by less than 10 nm from w1. The biased region 302 underlies the second pattern 206. In other embodiments, the biased region 302 may extend outside of the region underlying the second pattern 206. The biased region 302 illustrates a region of the sacrificial line element 204 where the edge of the element is biased such that it is non-collinear with the remainder of the edge of the sacrificial line element 204.

It is noted that the biased region 302 of the sacrificial line elements 204 provides for the adjacent spacer element 210 to be shifted. As shifted, the spacer element 210 adjacent the biased region 302 is no longer collinear with the spacer element 210 formed abutting the remainder (non-biased) region of the sacrificial line elements 204.

Referring to the example of FIG. 4, the first pattern 200 (described above with reference to FIG. 2) has been modified to provide a modified pattern 400. The modified pattern 400 includes the sacrificial line element 204 having a biased region 402. The sacrificial line elements 204 have a width w1. The sacrificial line elements 204 at the biased region 402 have a width w3. The width w3 is different than the width w1. In an embodiment, the width w3 is between approximately 0 nm and approximately 10 nm greater than width w1. In an embodiment, the width w3 is approximately 5 nm greater than the width w1. As illustrated, the width w3 is greater than the width w1, however other embodiments are possible. The biased region 402 underlies the second pattern 206. In other embodiments, the biased region 402 may extend outside of the region underlying the second pattern 206. It is noted that the modified pattern 400 includes an embodiment where at least one sacrificial line element 204 is not biased.

It is noted that the biased region 402 of the sacrificial line elements 204 provides for the adjacent spacer element 210 to be shifted. As shifted, the spacer element 210 adjacent the biased region 402 is no longer collinear with the spacer element 210 formed abutting the remainder (non-biased) region of the sacrificial line elements 204.

The modified pattern described with reference to block 106 of the method 100 and/or the embodiments of FIGS. 3 and 4 may be provided on a layout design file(s). For example, a GDSII file, or other suitable technology form. The patterns may also be formed on a photomask. The photomask may be an attenuating phase shift mask (att-PSM), an alternating PSM (alt-PSM), a chromeless phase shift mask (CPL), and/or other suitable mask types. The photomask includes a substrate. The photomask substrate may be a transparent substrate such as fused silica ($SiO_2$), or quartz, relatively free of defects, calcium fluoride, or other suitable material. The photomask may include attenuating material defining the first or second pattern; the attenuating material may include chrome or other materials such as, for example, Au, MoSi, CrN, Mo, $Nb_2O_5$, Ti, Ta, $MoO_3$, MoN, $Cr_2O_3$, TiN, ZrN, $TiO_2$, TaN, $Ta_2O_5$, NbN, $Si_3N_4$, ZrN, $Al_2O_3N$, $Al_2O_3R$, or a combination thereof. In an embodiment, the first modified pattern is provided on a first photomask and the second pattern is provided on a second photomask. The first and second photomasks may be two of the plurality of photomasks that define a mask set for an associated semiconductor device.

The method 100 then proceeds to block 108 where the modified first pattern and the second pattern are used to pattern a layer of a device. In an embodiment, the modified first pattern is provided on a first photomask, as described above with reference to FIGS. 3 and 4. In an embodiment, the second pattern is provided on a second photomask as described above with reference to FIGS. 3 and 4. The modified first pattern formed on a photomask may be used to pattern a layer of a semiconductor device formed on a substrate. The modified first pattern formed on a photomask may be used to pattern another layer of a semiconductor device formed on a substrate and overlying the layer having the first pattern.

In an embodiment, the modified first pattern is formed on a substrate and defines a plurality of mandrels or sacrificial line structures. The sacrificial line structures may be used in a pitch-reducing fabrication method such as described below with reference to FIG. 5. In an embodiment, the second pattern is formed on the substrate and defines a plurality of contact elements. The contact elements may include conductive features provided a connection with and/or between a gate structure and an interconnect feature (e.g., a multi-layer interconnect (MLI) feature.)

Thus, provided is a design methodology that biases a feature of a first pattern associated with a semiconductor device based on the positioning of a second, overlying, pattern of a semiconductor device. In an embodiment, a sacrificial line structure is biased such that a subsequently fabricated spacer element will be shifted in its position on the substrate. An embodiment implementing the design features of the method 100 is described below with reference to FIG. 5.

Figure 5:
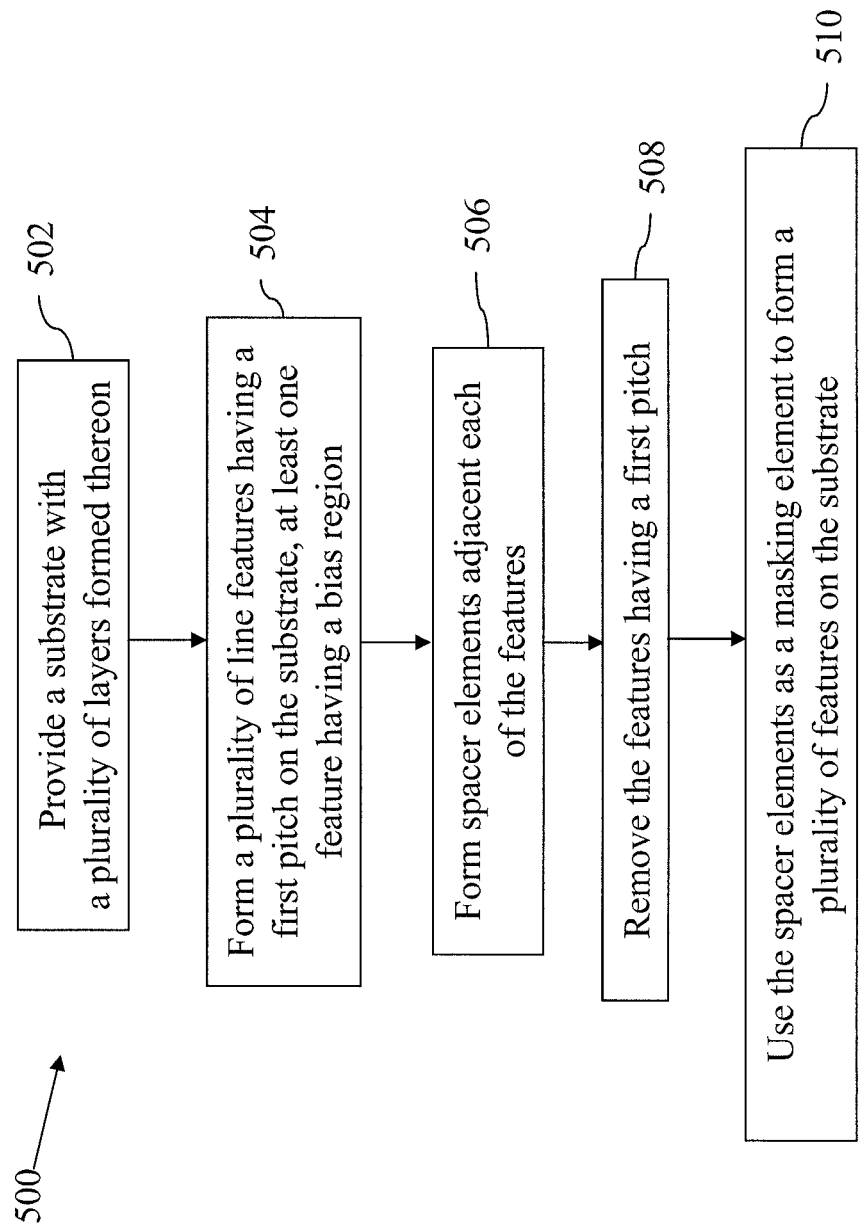
FIG. 5 is a flow chart of an embodiment of fabricating a semiconductor device according to one or more aspects of the present disclosure.
Figure 12:
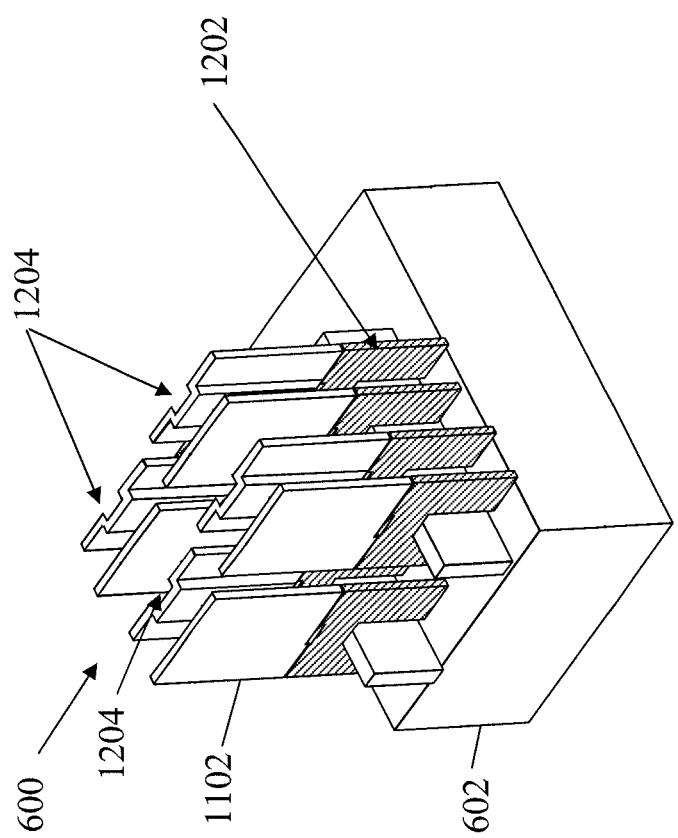
FIG. 12 illustrates a perspective view of an embodiment of a finFET device according to one or more aspects of the method 500.
Figure 13A:
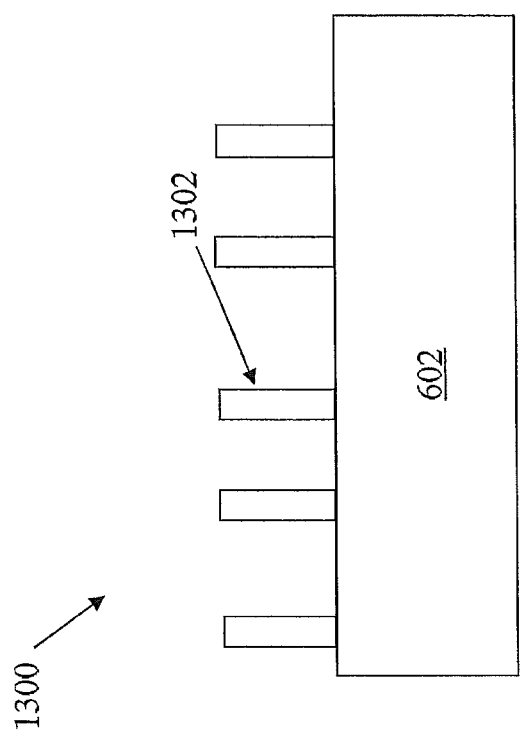
FIGS. 13A and 13B illustrate cross-sectional and top views of an embodiment of another transistor according to one or more aspects of the method 500.
Figure 13B:
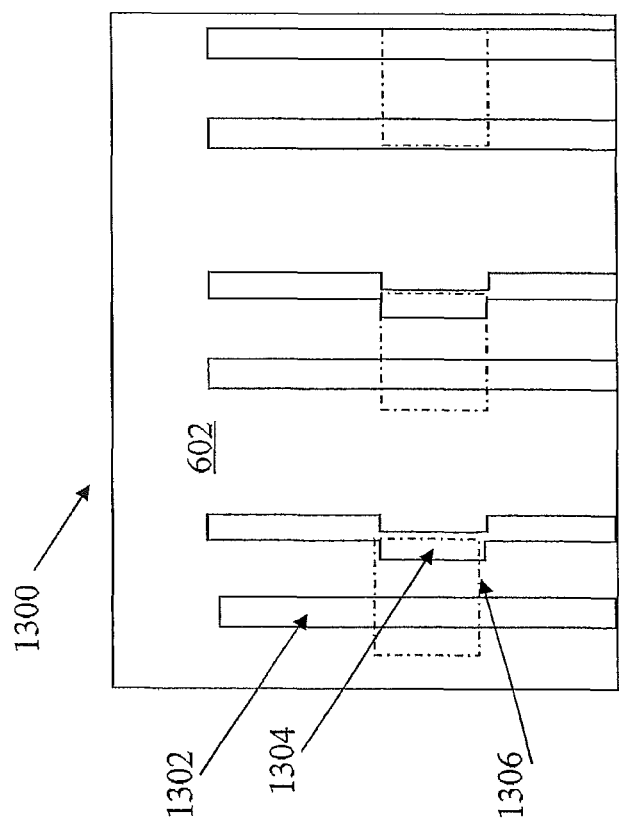

Referring now to FIG. 5, illustrated is a method 500 of fabricating a semiconductor device. In an embodiment, the semiconductor device includes a transistor. In an embodiment, the semiconductor device includes one or more fin-FET devices. FIGS. 6A, 6B, 7A, 7B, 8A, 8B, 9A, 9B, 10A, 10B, 11A, 11B are various views of an embodiment of a device 600 fabricated according to the method 500 of FIG. 5. It should be understood that FIGS. 6A, 6B, 7A, 7B, 8A, 8B, 9A, 9B, 10A, 10B, 11A, 11B and the device 600 are representative only and not intended to be limiting. FIG. 12 illustrates an embodiment of the semiconductor device having a finFET element. FIGS. 13A and 13B illustrate an embodiment of the semiconductor having a transistor (e.g., planar transistor).

It is understood that the method 500 includes steps having features of a complementary metal-oxide-semiconductor (CMOS) technology process flow and thus, are only described briefly herein. Additional steps may be performed before, after, and/or during the method 500. Similarly, one may recognize other features of a device that may benefit from the methods described herein.

It is also understood that parts of the semiconductor device 600 may be fabricated by complementary metal-oxide-semiconductor (CMOS) technology process flow, and thus some processes are only briefly described herein. Further, the semiconductor device 600 may include various other devices and features, such as additional transistors, bipolar junction transistors, resistors, capacitors, diodes, fuses, etc., but is simplified for a better understanding of the inventive concepts of the present disclosure. The semiconductor device 600 includes a plurality of semiconductor devices (e.g., transistors), which may be interconnected. In an embodiment, the semiconductor device 600 includes a transistor. In a further embodiment, the semiconductor device 600 is a finFET device.

The method 500 begins at block 502 where a substrate is provided. The substrate may have a plurality of layers and/or features formed thereon. The substrate may be a semiconductor substrate, such as a semiconductor wafer, is provided. The substrate may include silicon in a crystalline structure. In alternative embodiments, the substrate may include other elementary semiconductors such as germanium, or may include a compound semiconductor such as, silicon carbide, gallium arsenide, indium arsenide, or indium phosphide. The substrate may include a silicon on insulator (SOI) substrate. The substrate may further comprise one or more layers formed on the substrate. Examples of layers that may be formed include insulative layers, epitaxial layers, anti-reflective coatings, conductive layers including polysilicon layers, dielectric layers, and/or other layers known in the art including as described in the embodiments below.

The method 100 proceeds to block 104 where a plurality of line features are formed on the substrate. The plurality of features may include a plurality of sacrificial line features, such as described above with reference to the first pattern in block 102 of the method 100. The plurality of features has a pitch. A pitch, for purposes of this disclosure, includes the width of one feature plus the width of one space to the following feature. This metric may also be expressed as line/space where "line" includes the width of any feature (e.g. a line, a contact, a gate, a via, a trench), and space includes the width of one space. Each of the plurality of features includes at least two substantially vertical sidewalls.

The plurality of line features include at least one line feature that has been biased. The biased line feature includes a feature where one or more regions of the line element have been an increased or decreased width as compared to the remaining width of the line element. The biased line feature may be substantially similar to as discussed above with reference to the FIG. 1 and/or FIGS. 3 and 4. In an embodiment, the biasing includes increasing or decreasing the width of the line element by adjusting one (or more) edges of the line element. In an embodiment, the biasing amount may be between approximately 0 nm and approximately 10 nm. The biased region of the line feature may include a region where a contact element will be subsequently formed.

The plurality of line features may be formed using suitable photolithography processes. In an embodiment, photosensitive material (e.g., photoresist) is formed on the substrate. The photoresist in then exposed to a pattern using suitable radiation having passed through a photomask. In an embodiment, the photoresist is exposed to a pattern substantially similar to the first modified pattern 300 described above with reference to FIG. 3, or the first modified pattern 400, described above with reference to FIG. 4. The exposed photoresist is then baked, developed, and/or other suitable processes performed.

Figure 6A:
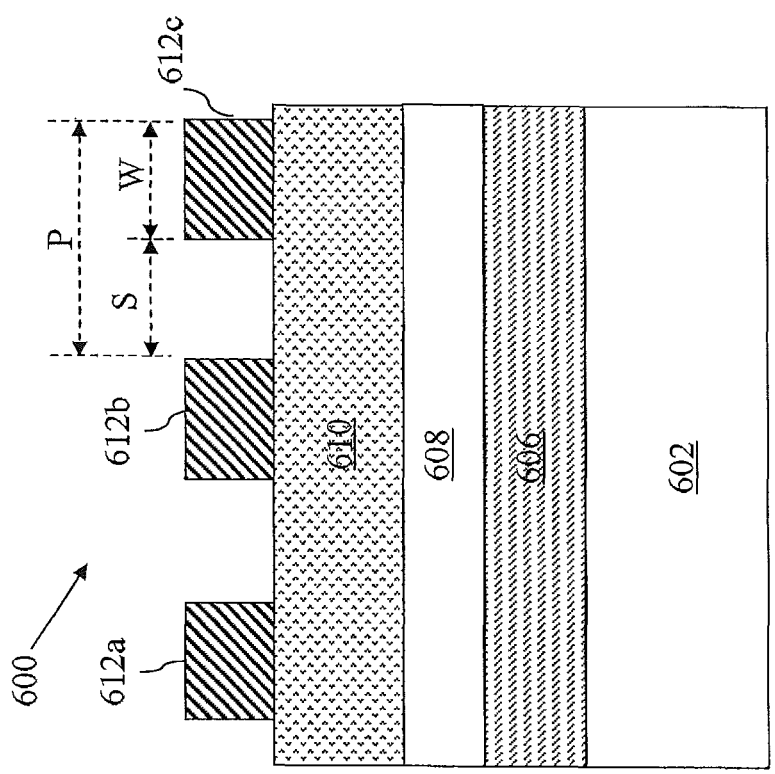
FIGS. 6A, 6B, 7A, 7B, 8A, 8B, 9A, 9B, 10A, 10B, 11A, 11B illustrate cross-sectional and top views of an embodiment of a semiconductor device 600 according to one or more aspects of the method 500.
Figure 6B:
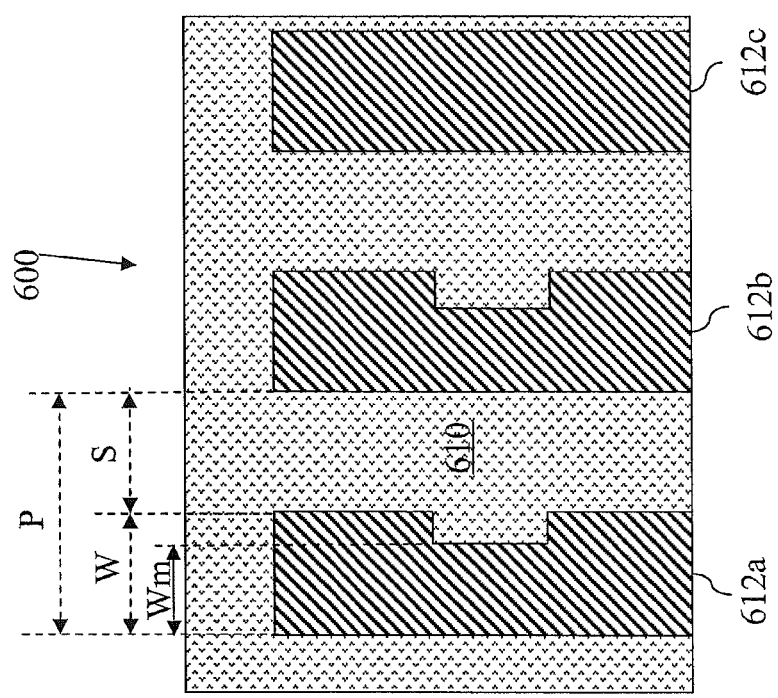

Referring to the example of FIGS. 6A and 6B, a semiconductor device 600 is illustrated. The semiconductor device 600 includes a substrate 602, and a plurality of layers 606, 608, and 610 disposed on the substrate 602. The plurality of layers 606, 608, and 610 may include hard mask layers, anti-reflective coatings, insulating layers, semiconductor layers, conducting layers, and/or other layers. Further, the plurality of layers 606, 608, and 610 are exemplary only and not intended to be limiting; the substrate 602 may include any number of layers. The layers 606, 608, and 610 may include materials having etch selectivity to one another.

The hard mask material, which may be included in one or more of the layers 606, 608, and/or 610, may include an amorphous carbon material. In other embodiments, the hard mask material may include oxides, silicon nitride, silicon oxy-nitride, silicon carbide, and/or other suitable dielectric materials. In further embodiments, additional and/or few layers may be present on the substrate 602. The layers 606, 608, and/or 610 may be formed using conventional processes known in the art such as, chemical vapor deposition (CVD), oxidation, physical vapor deposition (PVD), plasma enhanced CVD (PECVD), atmospheric pressure CVD (AP-CVD), atomic layer deposition (ALD), low pressure CVD (LPCVD), high density plasma CVD (HDPCVD), atomic layer CVD (ALCVD), and/or other suitable processes.

A plurality of features, illustrated as elements 612a, 612b, and 612c, are disposed on the substrate 602. The plurality of features 612a, 612b, and 612c may include photosensitive material such as photoresist. The photoresist features 612a, 612b, 612c include a width W. The photoresist features 612a, 612b, 612c have a spacing S. The pitch P includes the sum of the width W and the space S. In an embodiment, the width W is equal to the space S.

The features 612a and 612b are illustrated as biased features (e.g., having a region of modified width); however any number of biased features may be possible. The biased features 612a and 612b each include a region having a modified width Wm. The biased features and the modified width Wm may be defined by the pattern used to form the features on the substrate, such as described above with reference to FIG. 1.

In an embodiment, the width Wm is approximately less than approximately 10 nm different than the width W. In an embodiment, the width Wm is approximately 5 nm less than the width W. However, other embodiments are possible and within the scope of the present disclosure. It is noted that FIG. 6B illustrates the bias of the features 612a and 612b obtained by modifying an edge of each of the features 612a and 612b such that the edge is no longer collinear but displaced inward. However, other embodiments are possible.

Figure 7A:
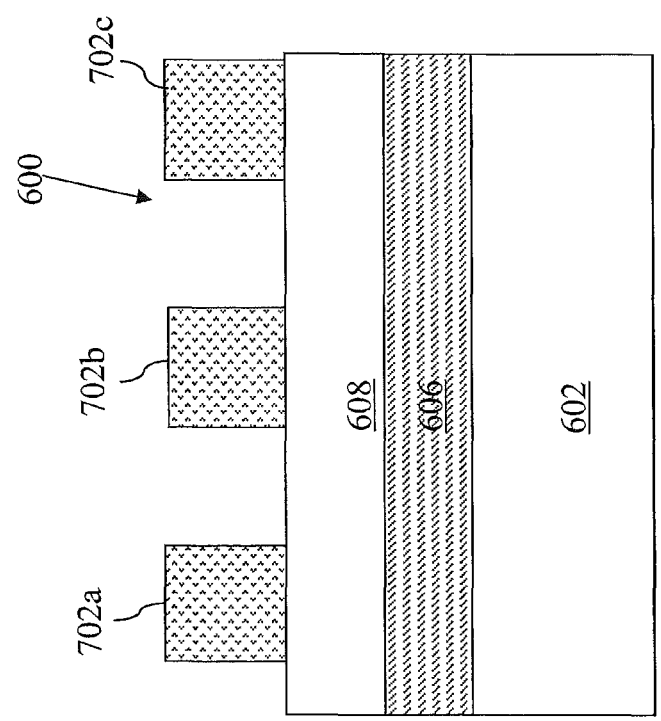
Figure 7B:
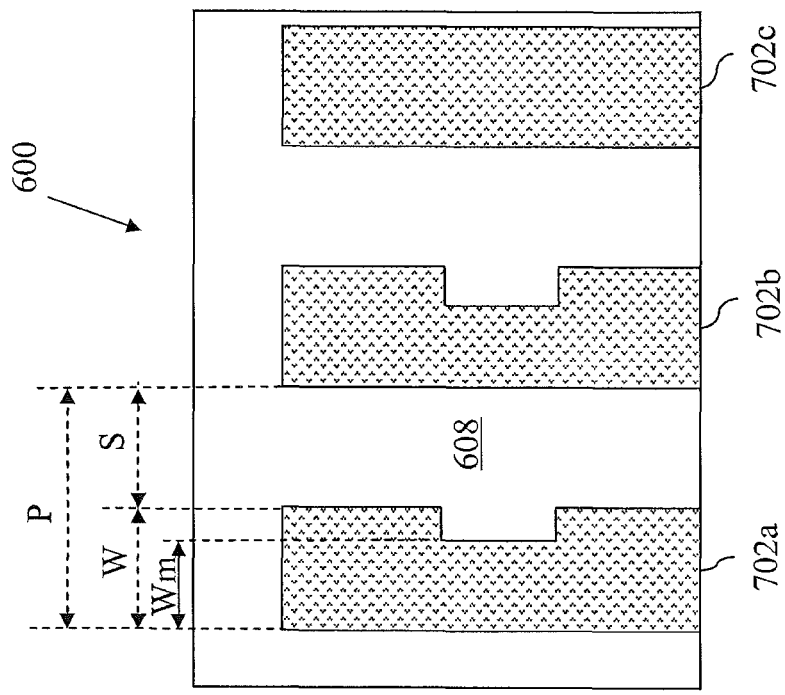

Referring now to FIGS. 7A and 7B, the features 612a, 612b, and 612c are used as masking elements to etch an underlying layer 610 (see FIG. 6A) to form a plurality of features 702a, 702b, and 702c respectively. In an embodiment, the elements 702a, 702b, and 702c are polysilicon. Alternative compositions include amorphous silicon. The elements 702a, 702b, and 702c may be sacrificial line elements, or mandrels. The etching may be formed using suitable wet etch, dry etch, plasma etch, and/or other etching processes. After the etching, the photoresist features 612a, 612b, and/or 612c may be stripped from the substrate 602.

The method 500 then proceeds to block 506 where a plurality of spacer elements are formed abutting each of the sidewalls of the line features formed in block 504. The spacer elements may be formed using conventional spacer formation processes. For example, a layer of material, such as oxide, may be deposited over the features formed in block 504 and etched, using an anisotropic etch, to form spacer elements abutting the sidewalls of the features.

In an embodiment of forming the spacer elements, a layer of oxide (e.g., silicon dioxide) is deposited in an atomic layer deposition (ALD) chamber. The oxide layer is then etched in a dielectric etcher, e.g., plasma etcher designed for etching dielectric films such as silicon oxide. In other embodiments, the spacer material may include silicon nitride, silicon carbide, silicon oxy-nitride, and/or combinations thereof. In the embodiments, a layer of spacer material may be formed by conventional processes known in the art such as, chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), ALD, and/or other processes known in the art. The formed layer of spacer material may then be etched using dry etch processes known in the art.

Figure 8A:
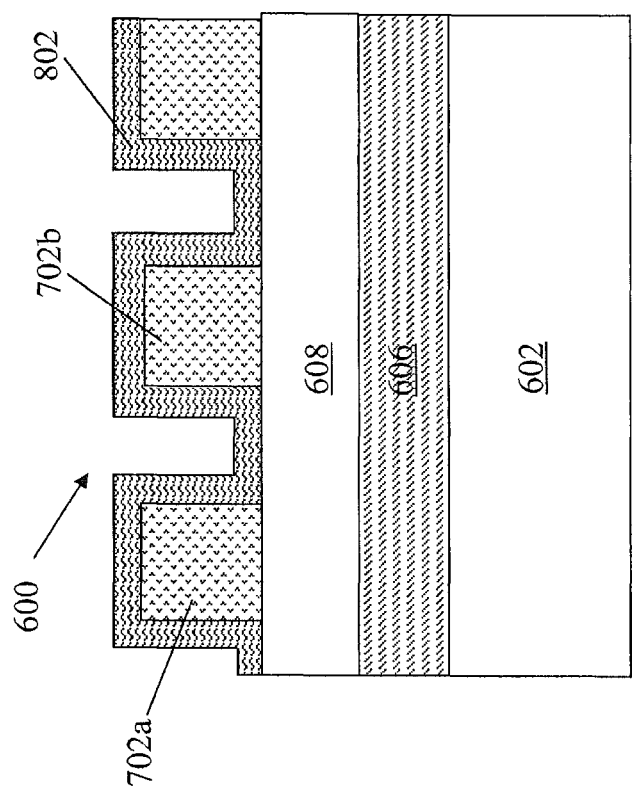
Figure 8B:
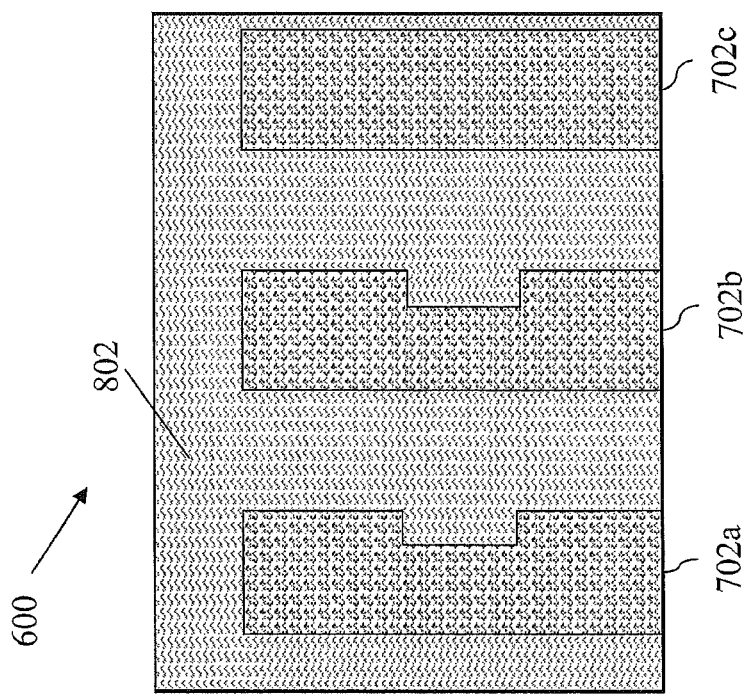

Referring to the example of FIGS. 8A and 8B, a layer of spacer material 802 is formed on the substrate. The spacer material 802 may be a conformal layer. The spacer material 802 may include a dielectric material such as silicon oxide, silicon nitride, silicon oxynitride, and/or other suitable composition. In an embodiment, the spacer material layer 802 has a thickness of approximately 10 nm, by way of example and not intending to be limiting.

Figure 9A:
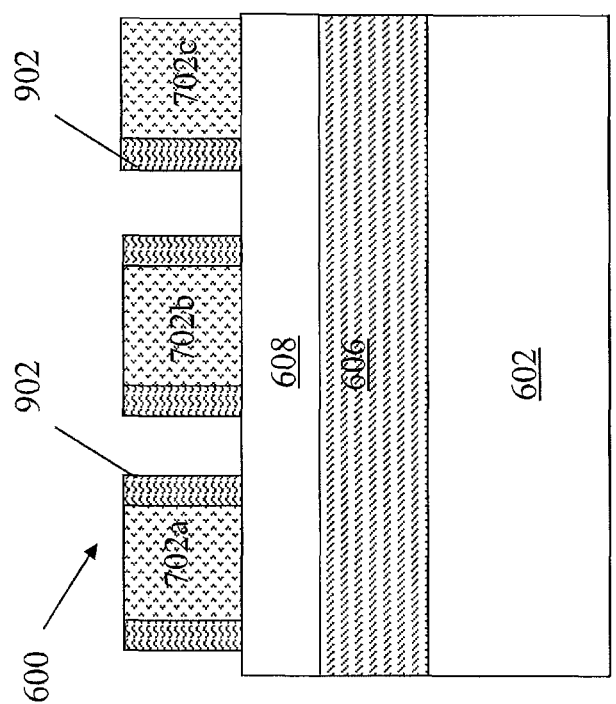
Figure 9B:
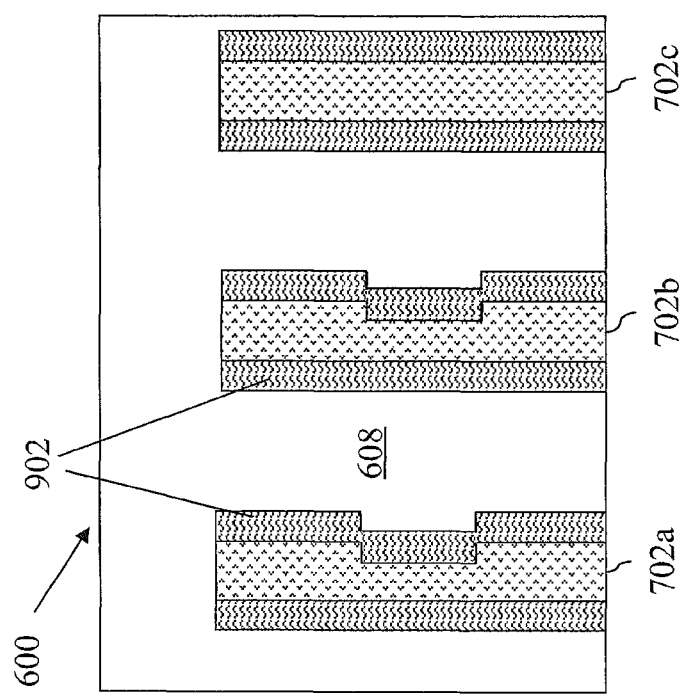

Referring to the example of FIGS. 9A and 9B, the spacer material layer 802 (FIG. 8A, 8B) is then etched to form spacer elements 902. The spacer elements 902 are formed abutting the sidewalls of the features 702a, 702b, and 702c. In an embodiment, the spacer material layer 802 is etched using multiple etching processes. For example, a first etch may form the elements on the sidewalls (e.g., removing the material on the tops of the line elements and the substrate surface) and a second etch may remove the end caps of the spacer elements. The formation of the spacer elements 902 may further include additional lithography processes (e.g., to remove the end caps of the spacer elements 902). FIG. 9B illustrates that at the biased region of the features 702a and 702b, the spacer element 902 is shifted or offset. In other words, the spacer element 902 at the biased region is no longer collinear with the remainder of the spacer element 902 (e.g., the non-biased region). In the present example, the spacer element 902 is offset or shifted inward at the biased region, however other embodiments are possible.

The method 500 then proceeds to block 508 where the line features having a first pitch (and having been formed in block 504 described above) are removed. In an embodiment, the line features may be removed by a wet etch process. The spacer elements formed in block 506 remain on the substrate. These spacers may have a pitch that is less than that of the features formed in block 504. In an embodiment, the pitch provided may be less than the resolution capability of a photolithography tool used in the method 500. Numerous other configurations are possible depending on the design requirements for the semiconductor device 600. In an embodiment, the features are removed using a wet etch process. The wet etch may include a phosphoric acid etch.

Figure 10A:
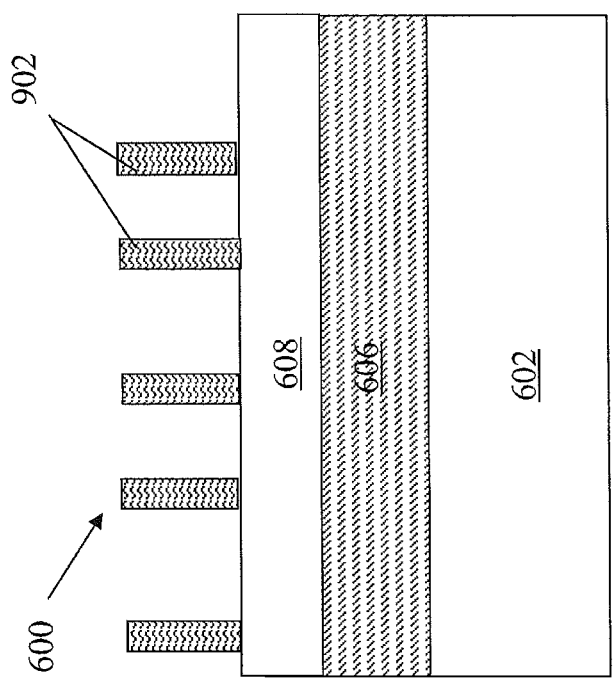
Figure 10B:
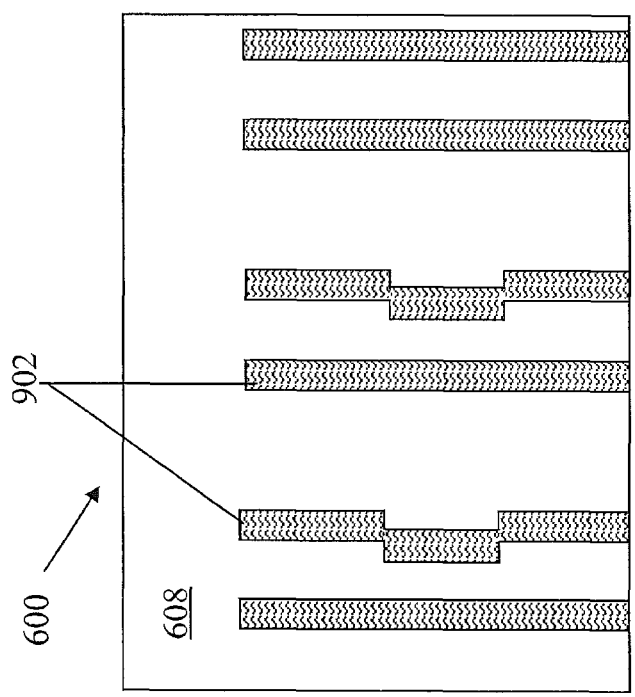

Referring to the example of FIGS. 10A and 10B, the sacrificial line elements 702a, 702b, and 702c have been removed from the substrate leaving the spacer elements 902.

The method 500 then proceeds to block 510 where the spacer elements are used as masking elements to etch underlying layer(s). In an embodiment, the spacer elements are used to define a pattern in an underlying hard mask layer. The hard mask material may include an amorphous carbon material. In other embodiments, the hard mask material may include oxides, silicon nitride, silicon oxy-nitride, silicon carbide, and/or other suitable dielectric materials. The underlying hard mask layer, as patterned, may then be used as a masking element to etch underlying target layer(s). In an embodiment, a layer is etched to form a plurality of gate structures. In a further embodiment, a polysilicon layer is etched to form a plurality of polysilicon gate structures. These polysilicon gate structures may be sacrificial or dummy gate structures. For example, the polysilicon gate structures may be subsequently replaced by a metal gate. In an embodiment, the gate structures are formed on fins extending from the substrate (e.g., provide gate structures for a finFET device). In an alternative embodiment, the gate structures are associated with planar transistors.

Figure 11A:
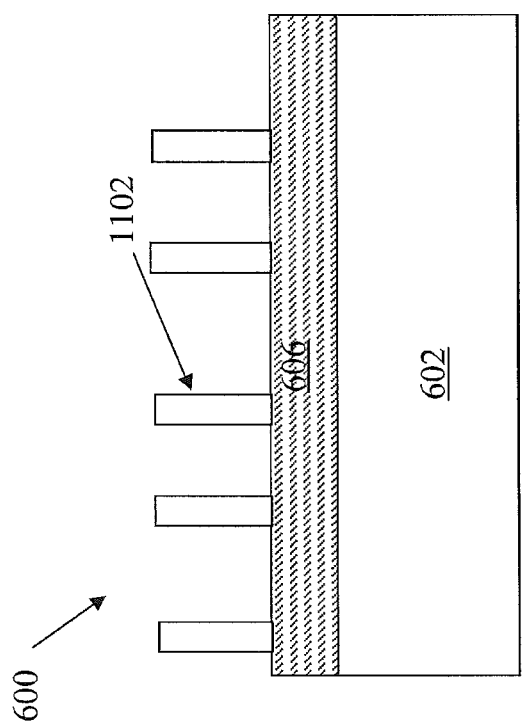
Figure 11B:
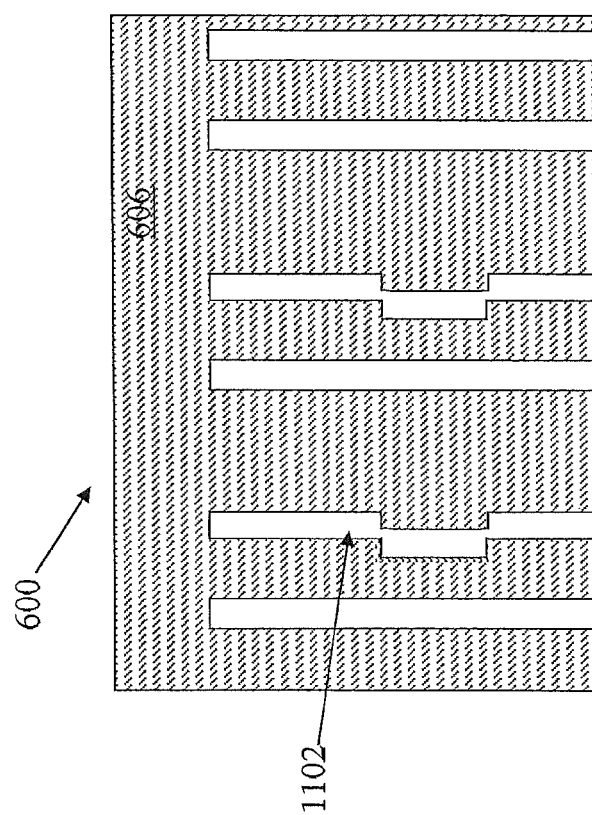

Referring to the example of FIG. 11A and FIG. 11B, the spacer elements 902 are used as masking elements to etch the underlying layer 608 (FIG. 10a) to form pattern 1102. In an embodiment, the layer 608 is an oxide hard mask layer. The pattern 1102 may be used as a masking element to etch the underlying layers and/or substrate. The spacer elements 902 may be removed from the substrate 602.

In an embodiment, the semiconductor device 600 described above with reference to FIGS. 6A, 6B, 7A, 7B, 8A, 8B, 9A, 9B, 10A, 10B, 11A, and 11B provide a finFET device. This is illustrated by way of example in FIG. 12. In the example of FIG. 12, the pattern 1102 is used as a masking element to introduce the pattern into the layer 304 (see FIG. 11A). In an embodiment, the layer 304 is a polysilicon layer. The layer 304 is etched into a plurality of gate structures 1202. A gate structure 1202 may include a gate dielectric layer and/or a gate electrode. The gate dielectric layer may include a dielectric material such as, silicon oxide, silicon nitride, silicon oxy-nitride, dielectric with a high dielectric constant (high k), and/or combinations thereof. Examples of high k materials include hafnium oxide, zirconium oxide, aluminum oxide, hafnium dioxide-alumina ($HfO_2$—$Al_2O_3$) alloy, or combinations thereof. The gate dielectric layer may be formed using conventional processes such as, photolithography, oxidation, deposition, etching, and/or a variety of other processes known in the art. The gate electrode layer includes conductive material. In an embodiment, the gate electrode includes polysilicon. In other embodiments, the gate may be a metal gate with the gate electrode including a metal composition. Examples of suitable metals for forming the gate electrode include Cu, W, Ti, Ta, TiN, TaN, NiSi, CoSi, and/or combinations thereof. The gate electrode material layer may be formed by conventional processes known in the art such as, physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), and/or other processes known in the art including photolithography and etching processes.

The gate structure formed in block 510 includes a shifted or offset region (as defined by the shift of the spacer element). This shifted or offset region may be at a portion of the gate structure where the design provides for a contact element to be formed (e.g., connected thereto). In an embodiment, the shifted region is provided to account for an alignment tolerance and/or error in the fabrication process (e.g., between the gate structure and the associated contact). The shifted region may directly overly the top surface of the fin extending from the substrate. Referring to the example of FIG. 12, a shifted region 1204 is illustrated in the gate structure 1202.

In an embodiment, the semiconductor device 600 described above with reference to FIGS. 6A, 6B, 7A, 7B, 8A, 8B, 9A, 9B, 10A, 10B, 11A, and 11B provide a transistor (e.g., planar transistor). This is illustrated by way of example in FIG. 13. In the example of FIG. 13, the pattern 1102 is used as a masking element to introduce the pattern into the layer 304 (see FIG. 11A). In an embodiment, the layer 304 is a polysilicon layer. The layer 304 is etched into a plurality of gate structures 1302. A gate structure 1302 may include a gate dielectric layer and/or a gate electrode. In an embodiment, the gate structure 1302 is a sacrificial or dummy gate structure (e.g., polysilicon). The gate structure 1302 may be subsequently removed from the substrate and a metal gate electrode formed in its place.

The gate structure 1302, or the replacement gate formed in the place of a dummy gate structure 1302, may include a gate dielectric layer having a dielectric material such as, silicon oxide, silicon nitride, silicon oxy-nitride, dielectric with a high dielectric constant (high k), and/or combinations thereof. Examples of high k materials include hafnium oxide, zirconium oxide, aluminum oxide, hafnium dioxide-alumina ($HfO_2$—$Al_2O_3$) alloy, or combinations thereof. The gate dielectric layer may be formed using conventional processes such as, photolithography, oxidation, deposition, etching, and/or a variety of other processes known in the art.

The gate structure 1302, or the replacement gate formed in the place of a dummy gate structure 1302, may include a conductive material. In an embodiment, the gate electrode includes polysilicon. In other embodiments, the gate structure 1302, or the replacement gate formed after the removal of the gate structure 1302, may be a metal gate with the gate electrode including a metal composition. Examples of suitable metals for forming the gate electrode include Cu, W, Ti, Ta, TiN, TaN, NiSi, CoSi, and/or combinations thereof. The gate electrode material layer may be formed by conventional processes known in the art such as, physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), and/or other processes known in the art including photolithography and etching processes.

The gate structure formed in block 510 includes a shifted or offset region (as defined by the shift of the spacer element). This shifted or offset region may be at a portion of the gate structure where the design provides for a contact element to be formed (e.g., connected thereto). In an embodiment, the shifted region is provided to account for an alignment tolerance and/or error in the fabrication process (e.g., between the gate structure and the associated contact). The shifted region may directly overly the top surface of the fin extending from the substrate. Referring to the example of FIG. 12, a shifted region 1204 is illustrated in the gate structure 1202. Referring to the example of FIG. 13B, a shifted region 1304 is illustrated in the gate structure 1302.

The method 500 then proceeds to form other features of the semiconductor device. In an embodiment, the method 500 includes forming a contact element on the gate structures described above in block 510. The contact element may be formed on a region of the gate structure defined by the shifted region of the spacer elements. A contact element may include a via etched on the substrate, in particular through one or more layers, such as insulating layers, formed on the substrate. The via may then be filled with conducting material such as, copper, aluminum, tungsten, tantalum, titanium, nickel, cobalt, metal silicide, metal nitride, polysilicon, and/or other materials possibly including one or more refractory layers or linings. The contact element may be formed using suitable photolithography, etching, and deposition processes (e.g., CVD, PVD, ALD). The contact element is illustrated as element 1304 in FIG. 13B.

In an embodiment, the features formed in block 510 include sacrificial gate structures. The method 500 may then continue, following a replacement gate process, to provide that the sacrificial gate structures are removed from the substrate and replaced with metal gate structures (e.g., including a metal gate electrode). The removal of the sacrificial structure provides for openings within which a metal gate will be formed, as is typically performed in a replacement gate process. The sacrificial gate structure removal may include removing a dummy gate electrode and/or a dummy gate dielectric layer. A sacrificial gate structure may be removed by an etching solution such as, for example, $NH_4OH$, dilute-HF, and/or other suitable etchant. In an alternative embodiment, the sacrificial gate structure may be removed by a suitable dry etching process. Example etchants include fluorine and/or chlorine based etchants. Exemplary processes to remove the dummy gate dielectric layer include liquid or gas phase diluted HF.

A metal gate structure may then be formed in the openings provided by the removal of the sacrificial gate structure. In an embodiment, these openings are defined by the features formed in block 510 having a shifted or biased region. Thus, the openings include a biased region (e.g., region having a different width). A gate structure may then be formed in the openings. The metal gate structure may include interfacial layer(s), gate dielectric layer(s), work function layer(s), fill metal layer(s) and/or other suitable materials for a metal gate structure. In other embodiments, the metal gate structure may further include capping layers, etch stop layers, and/or other suitable materials. The interfacial layer may include a dielectric material such as silicon oxide layer ($SiO_2$) or silicon oxynitride (SiON). The interfacial dielectric layer may be formed by chemical oxidation, thermal oxidation, atomic layer deposition (ALD), CVD, and/or other suitable dielectric. The gate dielectric layer may include silicon dioxide or other suitable dielectric. In an embodiment, the gate dielectric is a high-k dielectric layer. (As noted above, in alternative embodiments, the method 100 may include a gate dielectric first process where the gate dielectric formed underlying the dummy gate electrode is not removed.) The high-k dielectric layer may include hafnium oxide ($HfO_2$). Alternatively, the high-k dielectric layer may optionally include other high-k dielectrics, such as $TiO_2$, HfZrO, $Ta_2O_3$, $HfSiO_4$, $ZrO_2$, $ZrSiO_2$, combinations thereof, and/or other suitable material. The gate dielectric layer may be formed by atomic layer deposition (ALD), chemical vapor deposition (CVD), physical vapor deposition (PVD), and/or other suitable methods.

Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. Exemplary n-type work function metals include Ti, Ag, TaAl, TaAlC, TiAlN, TaC, TaCN, TaSiN, Mn, Zr, other suitable n-type work function materials, or combinations thereof. A work function value is associated with the material composition of the work function layer, and thus, the material of the first work function layer is chosen to tune its work function value so that a desired threshold voltage Vt is achieved in the device that is to be formed in the respective region. The work function layer(s) may be deposited by CVD, PVD, and/or other suitable process. The fill metal layer may include Al, W, or Cu and/or other suitable materials. The fill metal may be formed by CVD, PVD, plating, and/or other suitable processes. The fill metal may be deposited over the work function metal layer(s), and thereby filling in the remaining portion of the trenches or openings formed by the removal of the dummy gate electrode.

Thus, in an embodiment, the features formed in block 510 of the method 500 provide sacrificial gate structures, which are subsequently removed and replaced with a metal gate structure. As the sacrificial gate structures include a shifted or offset region (as defined by the shift of the spacer element abutting the biased region of the sacrificial line structure). This shifted or offset region is also present in the later formed replacement gate (e.g., metal gate). The shifted or offset region may be at a portion of the gate structure where the design provides for a contact element to be formed (e.g., connected thereto) to the gate structure. In an embodiment, the shifted region is provided to account for an alignment tolerance and/or error in the fabrication process (e.g., between the gate structure and the associated contact). Referring to the example of FIG. 13, a shifted region 1304 is illustrated in the gate structure 1302. In an embodiment, the gate structure 1302 is a metal gate structure formed by a replacement gate methodology such as discussed above.

While the method 500 is described above as patterning a plurality of gate features, one of ordinary skill would recognize that other features may be provided including device features such as, a trench including a fin, a shallow trench isolation (STI) structure, a line including an interconnect (e.g. metal line, contact via), a gate structure including, a contact including a via, and/or other features known in the art.

One system for providing the disclosed embodiments is illustrated in FIG. 14. Illustrated is an embodiment of a computer system 1400 for implementing embodiments of the present disclosure including the systems and methods described herein. In an embodiment, the computer system 1400 includes functionality providing for one or more steps of designing a circuit or chip including performing simulations, verification analysis (e.g., DRC, LVS), extraction of parameters, layout, place and route, DFM, and/or other suitable tools and/or procedures.

The computer system 1400 includes a microprocessor 1404, an input device 1410, a storage device 1406, a system memory 1408, a display 1414, and a communication device 1412 all interconnected by one or more buses 1402. The storage device 1406 may be a floppy drive, hard drive, CD-ROM, optical device or any other storage device. In addition, the storage device 1406 may be capable of receiving a floppy disk, CD-ROM, DVD-ROM, or any other form of computer-readable medium that may contain computer-executable instructions. The communications device 1412 may be a modem, a network card, or any other device to enable the computer system to communicate with other nodes. It is understood that any computer system 1400 could represent a plurality of interconnected computer systems such as, personal computers, mainframes, smartphones, and/or other telephonic devices.

The computer system 1400 includes hardware capable of executing machine-readable instructions as well as the software for executing acts (typically machine-readable instructions) that produce a desired result. Software includes any machine code stored in any memory medium, such as RAM or ROM, and machine code stored on other storage devices (such as floppy disks, flash memory, or a CD ROM, for example). Software may include source or object code, for example. In additional software encompasses any set of instructions capable of being executed in a client machine or server. Any combination of hardware and software may comprise a computer system. The system memory 1408 may be configured to store a design database, library, technology files, design rules, PDKs, models, decks, layout files, and/or other information used in the design of a semiconductor device.

Computer readable mediums include passive data storage, such as RAM as well as semi-permanent data storage such as a compact disk read only memory (CD-ROM). In an embodiment of the present disclosure may be embodied in the RAM of a computer to transform a standard computer into a new specific computing machine. Data structures are defined organizations of data that may enable an embodiment of the present disclosure. For example, a data structure may provide an organization of data, or an organization of executable code. Data signals could be carried across transmission mediums and store and transport various data structures, and thus, may be used to transport an embodiment of the present disclosure.

The computer system 1400 may be used to implement one or more of the methods and/or devices described herein. In particular, the computer system 1400 may be operable to generate, store, manipulate, and/or perform other actions on a layout pattern (e.g., GDSII file) associated with an integrated circuit. For example, in an embodiment, one or more of the patterns described above (FIGS. 2, 3, 4) may be generated, manipulated, and/or stored using the computer system 1400. The patterns provided by the computer system 1400 may be in a typical layout design file format which is communicated to one or more other computer systems for use in fabricating photomasks including the defined patterns. In other embodiments, portions of the computer system 1400 are operable to receive, generate, store, or compute models or data relating to an offset of two features in a fabrication process.

In summary, the methods and devices disclosed herein provide for modifying a layout including biasing a line feature to account for alignment with an overlying feature. For example, a sacrificial line element may be biased such that a conformal coating of spacer material will provide for a shifted pattern at the point of the biasing (e.g., offset or shifted element). This can allow use of the shifted spacer elements to pattern underlying layers such that a resultant feature may be better suited for alignment with a subsequently formed feature (e.g., a gate aligned with a contact). This method may be advantageous as compared to providing a "jog" or additional width of a spacer element formed adjacent a mandrel as the spacer patterning can not easily support the additional width. The offset or shifted element may assist not only in improving the tolerance of the landing area for an overlying feature (e.g., contact), it may also improve device performance (e.g., Rc).

Thus, in an embodiment described is a finFET transistor including a substrate having a fin extending from the substrate. A gate structure is formed on the fin. The gate structure includes a first portion and a second portion; the first and second portions each have a first edge and an opposing second edge where the first edges are substantially collinear and the second edges are substantially collinear. The gate structure also includes an offset portion interposing the first portion and the second portion. The offset portion has a first edge and an opposing second edge. The first edge and the second edge are non-collinear with the first and second edges of the first and second portions of the polysilicon gate structure. In other words, the offset portion is offset or shifted from the first and second portions. A contact element connected to the offset portion of the polysilicon gate structure. In an embodiment, the gate structure is contiguous, or in other words, the first, second and offset portions are all physically connected.

In an embodiment described is a transistor including a gate structure disposed thereon. The gate structure includes a first portion and a second portion; the first and second portions each have a first edge and an opposing second edge where the first edges are substantially collinear and the second edges are substantially collinear. The gate structure also includes an offset portion interposing the first portion and the second portion. The offset portion has a first edge and an opposing second edge. The first edge and the second edge are non-collinear with the first and second edges of the first and second portions of the gate structure. In other words, the offset portion is offset or shifted from the first and second portions. In an embodiment, a contact element connected to the offset portion of the gate structure. In an embodiment, the gate structure is contiguous, or in other words, the first, second and offset portions are all physically connected. The gate structure may be the gate structure of a planar transistor, for example, having a single interface surface with an underlying substrate.

In another embodiment, a method is described which includes providing a layout of a device including a plurality of transistors. The layout includes a first layer defining a plurality of sacrificial line elements and a second layer defining a contact element. The method continues to modify a first sacrificial line element of the plurality of sacrificial line element in a region underlying the contact element to form a modified layout. The layout may be used to fabricate the semiconductor device.

Also described is a method of fabricating a semiconductor device includes forming a plurality of line element on a provided substrate. The plurality of line elements includes a first line element having a first region having a first width and a biased region having a second width. The second width different than the first width. (In an embodiment the plurality of line elements are sacrificial structures used to form a reduced pitch.) Spacer elements are then formed abutting sidewalls of each of the plurality of line elements. After forming the spacer elements, the plurality of line elements from the substrate are removed from the substrate. An underlying layer is etched using the spacer elements after removing the plurality of line elements.

What is claimed is:

1. A finFET transistor, comprising:
a substrate having a fin extending from the substrate;
a gate structure formed on the fin, wherein the gate structure includes:
a first portion and a second portion, wherein the first and second portions each have a first edge and an opposing second edge, and wherein the first edges are substantially collinear and the second edges are substantially collinear; and
an offset portion interposing the first portion and the second portion, the offset portion having a third edge and a fourth edge, wherein the third edge and the fourth edge are non-collinear with the first and second edges of the first and second portions of the gate structure, and wherein the third edge and the fourth edge are offset a first distance in a first direction from the first edges and second edges respectively; and
a contact element connected to the offset portion of the gate structure.

2. The finFET transistor of claim 1, wherein the offset portion directly overlies the fin.

3. The finFET transistor of claim 1, wherein the first portion includes a sidewall, and wherein the first portion sidewall interfaces a lateral sidewall of the fin.

4. The finFET transistor of claim 1, wherein the gate structure includes a metal gate electrode.

5. The finFET transistor of claim 1, wherein the contact element is a conductive feature that lands directly on a top surface of the offset portion.

6. The finFET transistor of claim 1, wherein the gate structure includes a high-k dielectric layer and an overlying metal gate electrode.

7. A semiconductor device, comprising:
a first gate structure formed on a semiconductor substrate, wherein the first gate structure has a first side and an opposing second side and includes:
a first portion and a second portion, wherein the first and second portions each have a first edge defining the first side of the gate structure and an opposing second edge defining the second side of the gate structure; and wherein the first edges are substantially collinear and the second edges are substantially collinear; and
an offset portion contiguous with the first and second portions and interposing the first portion and the second portion, the offset portion having a third edge defining the first side of the gate structure and a fourth edge defining the second side of the gate structure, wherein the third edge is non-collinear with respective on of the first edges of the first and second portions of the gate structure; and
a second gate structure on the semiconductor substrate, wherein the second gate structure has substantially collinear sidewalls extending from a first end to an opposing second end of the second gate structure.

8. The semiconductor device of claim 7, wherein the gate structure includes a metal gate electrode.

9. The semiconductor device of claim 7, further comprising:
   a contact element landing on a top surface of the offset portion of the gate structure.

10. The semiconductor device of claim 7, wherein the gate structure interfaces a single, planar surface of the semiconductor substrate.

11. The semiconductor device of claim 7, wherein the second gate structure on the semiconductor substrate is the next adjacent gate structure to the first gate structure.

12. The semiconductor device of claim 7, wherein the gate structure interfaces a fin of a fin-type field effect transistor (FET).

13. The semiconductor device of claim 12, wherein the offset portion directly overlies the fin.

14. The semiconductor device of claim 12, wherein the third edge of the offset portion is offset from the first edge of the first portion by a distance of less than approximately 10 nanometer.

15. The semiconductor device of claim 12, wherein a width of the offset portion is substantially equal to a width of the first portion, wherein the width of the offset portion is defined as a distance between the third and fourth edge of the offset portion.

16. A semiconductor device, comprising:
   a first gate structure including a gate dielectric layer and a metal gate electrode, wherein the gate structure has a first side and an opposing second side and includes:
      a first portion and a second portion, wherein the first and second portions each have a first edge defining the first side and an opposing second edge defining the second side, and wherein the first edges are substantially collinear and the second edges are substantially collinear; and
      an offset portion interposing the first portion and the second portion, the offset portion having a third edge defining the first side and a fourth edge defining the second side, wherein the third edge is spaced a first distance from the first edges and the fourth edge is spaced the first distance from the second edges, wherein the first distance is in a direction perpendicular to the first edge, and wherein a width of the offset portion is substantially equal to the width of each of the first portion and the second portion; and
   a contact element disposed over the offset portion of the gate structure.

17. The semiconductor device of claim 16, further comprising:
   a second gate structure having a contiguous, collinear edge extending the distance of the first portion, second portion and offset portion of the first gate structure.

18. The semiconductor device of claim 16, wherein the offset portion is vertically aligned with a fin element disposed under the gate structure.

19. The semiconductor device of claim 18, wherein the first portion is disposed to a first side of the fin element and the second portion is disposed to a second, opposing side of the fin element.

20. The semiconductor device of claim 16, wherein the first distance is less than approximately 10 nanometers.

* * * * *